(12) United States Patent
Tsukasa (10) Patent No.: US 9,956,722 B2
(45) Date of Patent: May 1, 2018

(54) METHOD AND DEVICE FOR THERMOCOMPRESSION BONDING

(71) Applicant: STRATEC Consumables GmbH, Anif (AT)

(72) Inventor: Murota Tsukasa, Shizuoka (JP)

(73) Assignee: STRATEC CONSUMABLES GMBH, Anif (AT)

( * ) Notice: Subject to any disclaimer, the term of this patent is extended or adjusted under 35 U.S.C. 154(b) by 0 days. days.

(21) Appl. No.: 14/245,566

(22) Filed: Apr. 4, 2014

(65) Prior Publication Data

US 2014/0216659 A1 Aug. 7, 2014

Related U.S. Application Data

(63) Continuation of application No. 13/270,605, filed on Oct. 11, 2011, now Pat. No. 8,691,039.

(30) Foreign Application Priority Data

Oct. 18, 2010 (JP) .................................. 2010-233935

(51) Int. Cl.
*B29C 65/14* (2006.01)
*B01L 3/00* (2006.01)
(Continued)

(52) U.S. Cl.
CPC .... *B29C 65/1412* (2013.01); *B01L 3/502707* (2013.01); *B29C 65/18* (2013.01); *B29C 66/026* (2013.01); *B29C 66/028* (2013.01); *B29C 66/0242* (2013.01); *B29C 66/343* (2013.01); *B29C 66/3494* (2013.01); *B29C 66/54* (2013.01); *B29C 66/91411* (2013.01); *B29C 66/91443* (2013.01); *B29C 66/91445* (2013.01); *B29C 66/91935* (2013.01); *B29C 66/91945* (2013.01); *B29C 66/91951* (2013.01);
(Continued)

(58) Field of Classification Search
CPC ......... B29C 66/91411; B29C 66/91443; B29C 66/91445; B29C 66/92921; B29C 66/54; B29C 66/343; B29C 66/028; B29C 66/0242; B81C 3/001
See application file for complete search history.

(56) References Cited

U.S. PATENT DOCUMENTS 3,904,465 A 9/1975 Haase et al.
8,691,039 B2 4/2014 Murota
(Continued)

FOREIGN PATENT DOCUMENTS

GB 1190567 5/1970
JP 09-169055 A 6/1997
(Continued)

*Primary Examiner* — Daniel McNally
(74) *Attorney, Agent, or Firm* — 24IP Law Group; Timothy R DeWitt (57) ABSTRACT

There are provided a method and device for thermocompression bonding of possibly preventing any warping of a resin member to be caused by thermocompression bonding, and of possibly reducing the time to be taken for processing. The method for thermocompression bonding, includes: preheating a resin member using an infrared radiation section; and subjecting the resin member to thermocompression bonding using a heating section and a pressurization section.

8 Claims, 7 Drawing Sheets

(51) Int. Cl.
  *B29C 65/18* (2006.01)
  *B29C 65/00* (2006.01)
  *B81C 3/00* (2006.01)
  *B29C 65/82* (2006.01)
  *B29L 31/00* (2006.01)
  *B29C 65/78* (2006.01)

(52) U.S. Cl.
  CPC .. *B29C 66/92443* (2013.01); *B29C 66/92921* (2013.01); *B81C 3/001* (2013.01); *B01L 2300/168* (2013.01); *B29C 65/006* (2013.01); *B29C 65/7841* (2013.01); *B29C 65/8253* (2013.01); *B29C 66/71* (2013.01); *B29C 66/73365* (2013.01); *B29C 66/919* (2013.01); *B29K 2995/0027* (2013.01); *B29L 2031/756* (2013.01); *B81B 2201/058* (2013.01); *B81C 2203/037* (2013.01)

(56) References Cited

U.S. PATENT DOCUMENTS

| | | | |
|---|---|---|---|
| 2002/0108707 A1* | 8/2002 | Kobayashi | B29C 43/36 156/275.5 |
| 2003/0094240 A1* | 5/2003 | Sarmiento | B29C 65/1412 156/379.8 |
| 2003/0159915 A1 | 8/2003 | Jing et al. | |
| 2004/0112518 A1 | 6/2004 | Rossier et al. | |
| 2006/0096363 A1* | 5/2006 | Sawada | G01M 99/008 73/168 |
| 2009/0250163 A1* | 10/2009 | Kashiwagi | B29C 65/48 156/272.6 |
| 2010/0230613 A1* | 9/2010 | Pieprzyk | B01L 3/502738 250/459.1 |
| 2012/0205040 A1 | 8/2012 | Murota | |

FOREIGN PATENT DOCUMENTS

| | | | |
|---|---|---|---|
| JP | 2002-251801 A | 9/2002 | |
| JP | 2003-011232 | 1/2003 | |
| JP | 2006-264017 A | 10/2006 | |
| JP | 2007123343 A * | 5/2007 | H01L 24/75 |
| JP | 2008-019348 A | 1/2008 | |
| JP | 2009-295787 A | 12/2009 | |
| WO | WO 2004/039562 | 5/2004 | |
| WO | WO 2005/095089 | 10/2005 | |
| WO | WO 2008/007787 | 1/2008 | |
| WO | WO 2008/102585 | 8/2008 | |
| WO | WO 2009/103981 | 8/2009 | |
| WO | WO 2010/021264 A1 | 2/2010 | |

* cited by examiner

METHOD AND DEVICE FOR THERMOCOMPRESSION BONDING

CROSS-REFERENCE TO RELATED APPLICATIONS

This application is a continuation of and claims the benefit under 35 U.S.C. § 120 of U.S. patent application Ser. No. 13/270,605, titled "METHOD AND DEVICE FOR THERMOCOMPRESSION BONDING," filed on Oct. 11, 2011, which claims the benefit under 35 U.S.C. § 119 of Japanese Patent Application JP 2010-233935, filed on Oct. 18, 2010. The entire contents of these applications are hereby incorporated by reference in their entireties.

BACKGROUND

The present disclosure relates to a method and device for thermocompression bonding Thermocompression bonding is known as diffusion bonding with which atoms are diffused on a surface for bonding. With the thermocompression bonding, a plurality of members is heated up to any appropriate temperature of their melting points or lower, and then is put under pressure to a degree not causing plastic deformation as much as possible. As an example, the thermocompression bonding as such is used for bonding of electrode terminals between the substrate of a liquid crystal panel and any external drive circuit (for example, see Japanese Unexamined Patent Application Publication No. 2009-295787).

With the general method for thermocompression bonding described in Japanese Unexamined Patent Application Publication No. 2009-295787, first of all, a section for thermocompression bonding is coated with an anisotropic conductive material, and then is a bare chip being a resin member for thermocompression bonding use temporarily fixed to the thermocompression-bonding section. The thermocompression-bonding section is then disposed on a backup table, and a heated heater bar is brought to come in contact with the bare chip of the thermocompression-bonding section. The thermocompression-bonding section is then put under pressure of a predetermined level with the bare chip remained fixed thereto, and the resulting structure is kept as it is for a predetermined length of time. With heating and pressurization as such, the thermocompression bonding is performed with the thermosetting anisotropic conductive material working as an adhesive.

Also with the method for thermocompression bonding described above, the backup table for supporting the bare chip is heated in advance with the aim of preventing the resin member from warping, and of reducing the time to be taken for thermocompression bonding. By heating in advance the backup table as such, the bare chip placed on the backup table is heated in advance before thermocompression bonding. Such preheating makes uniform the temperature distribution of the bare chip during thermocompression bonding, thereby being able to prevent any possible warping of the resin member.

SUMMARY

With such a method of making the heated plate come in direct contact with the bare chip, i.e., method of heating the backup table, however, there is a difficulty in making uniform the heat distribution of the bare chip in the thickness direction when it is thick in size. Especially when the heat transfer coefficient is small, the heat is difficult to reach the center portion of the resin member from the surface thereof heated by the backup table, and it thus takes time to make uniform the temperature of the resin member in its entirety. As a result, the bare chip becomes easily warped during the process of preheating. Such warping of the bare chip is conspicuously observed when the bare chip is made of resin whose heat transfer coefficient is small and the thermal expansion coefficient is large. Accordingly, when a bare chip in use is made of resin, with such a method for preventing any possible warping of the bare chip using the heated backup table, the backup table and the bare chip are expected to be thermally controlled with good accuracy. Therefore, with the method as such, preventing any possible warping of the bare chip is very difficult.

It is thus desirable to provide a method and device for thermocompression bonding of possibly preventing any warping of a resin member to be caused by thermocompression bonding, and of possibly reducing the time to be taken for processing.

A method for thermocompression bonding according to an embodiment of the present disclosure includes preheating a resin member using an infrared radiation section, and subjecting the resin member to thermocompression bonding using a heating section and a pressurization section.

Moreover, a device for thermocompression bonding according to an embodiment of the present disclosure includes, a preheating section including an infrared radiation section, a thermocompression bonding section including a heating section and a pressurization section, and a transfer section transferring a resin member from the preheating section to the thermocompression bonding section while the resin member is remained in a preheated state.

By a resin member exposed to infrared radiation, the resin member absorbs the infrared thereinto from the radiation surface thereof. As such, a process of preheating is to be completed uniformly in a short time. With the resin member heated uniformly as such, the resin member is not to be warped easily. Also with the process of preheating, the time to be taken for thermocompression bonding is possibly reduced.

According to the embodiments of the present disclosure, provided are a method and device for thermocompression bonding of possibly preventing any warping of a resin member to be caused by thermocompression bonding, and of possibly reducing the time to be taken for processing.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENT

In the below, while the most preferred embodiment of the present disclosure is described, the description is in all aspects illustrative and not restrictive.

In the below, a description is to be given in the following order.

1. Embodiment of Method for Thermocompression Bonding
2. Embodiment of Device for Thermocompression Bonding
3. Example of Method for Thermocompression Bonding

1. Embodiment of Method for Thermocompression Bonding

In the below, described is a method for thermocompression bonding in a specific embodiment of the present disclosure.

Figure 1:
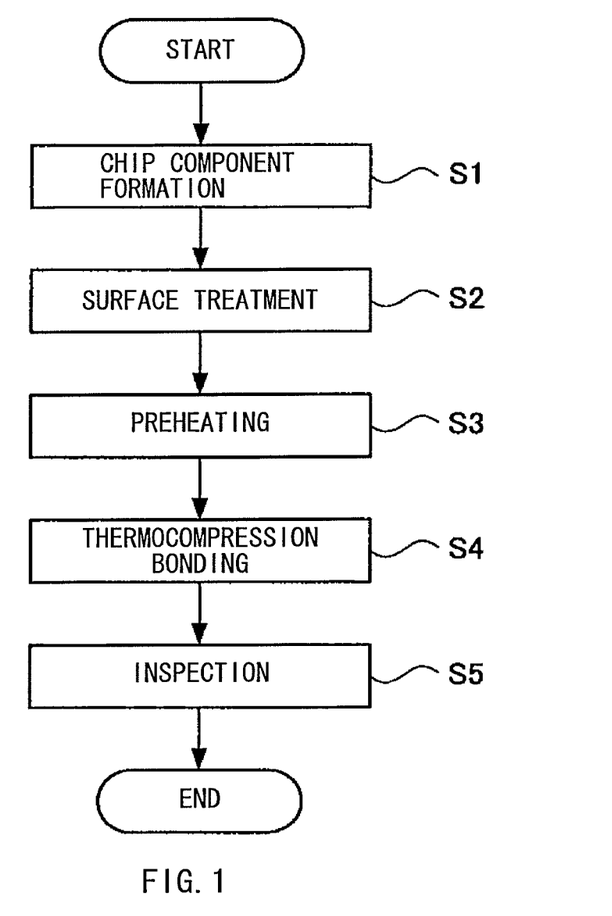
FIG. 1 is a flowchart of a manufacture method of a microfluidic chip as an embodiment of a method for thermocompression bonding of the present disclosure.

FIG. 1 is a flowchart of a manufacture method of a microfluidic chip to which the method for thermocompression bonding in the embodiment is applied. A microfluidic chip is a chip component made of resin with a micrometer-sized fluid path formed on a substrate, and is used as a resin member for thermocompression bonding. The microfluidic chip made of resin as such is configured by bonding a chip component to another, i.e., one chip component is formed with a groove being a fluid path for use as the substrate, and the other chip component is formed with a groove being a fluid path for use as the lid. For bonding of the substrate and lid as such, used is the method for thermocompression bonding in this embodiment.

(Manufacture of Microfluidic Chip)

The manufacture procedure of a microfluidic chip includes processes of chip component formation (Step S1), surface treatment (Step S2), preheating (Step S3), thermocompression bonding (Step S4), and inspection (fluid path inspection and defect inspection) (Step S5).

In the process of chip component formation in Step S1, groove-formed chip components for use in a microfluidic chip are formed from a resin member, which is formed by injection molding or film extrusion.

In the process of surface treatment in Step S2, before bonding of the chip component to another, the surfaces thereof for bonding are washed and then subjected to surface modification.

In the process of preheating in Step S3, for the aim of reducing the time for heating during thermocompression bonding, an infrared lamp heater (IR heater) is used for heating as preprocessing of the thermocompression bonding.

In the process of thermocompression bonding in Step S4, the chip components are heated and then put under pressure with their bonding surfaces in contact with each other so that the chip components are bonded together by thermocompression bonding.

In the process of inspection in Step S5, the microfluidic chip formed by thermocompression bonding is inspected for defects in the fluid path, shape, or others thereof.

In the below, the processes as above are described.

(Chip Component Formation)

The chip components in use are each a resin member formed by injection molding or film extrusion.

First of all, a stamper is made to give a detailed shape such as fluid path to the chip component of the microfluidic chip. The stamper for use to manufacture the microfluidic chip as such is made by electrochemical casting (Ni electroforming) using a glass substrate or others as a master, for example. Alternatively, the stamper may be made from a glass substrate, a silicon substrate, and others with application of a semiconductor manufacture technology.

Next, using the stamper made as such, the resin member formed by injection molding or others is formed with a micro fluid path for the microfluidic chip use.

The resin material for thermocompression bonding use is a thermoplastic resin available for thermocompression bonding, but is not specifically restricted in type as long as the material has a high infrared transmittance.

Some resin materials have an infrared transmittance dependent on wavelength. In consideration thereof, in the wavelength range of 850 nm to 2500 nm both inclusive, the resin material preferably has an infrared transmittance of 80% or higher but lower than 100%, and more preferably 85% or higher but lower than 95% excepting at a peak of absorption. Moreover, at the peak of absorption, the infrared transmittance is preferably 40% or higher but lower than 100%, and more preferably 50% or higher but lower than 95%.

When an absorption rate is high, the amount of infrared radiation greatly varies depending on which side of the surface exposed to radiation, i.e., front surface side or undersurface side, and thus the surface is not uniformly exposed to radiation in its entirety. As a result, the extent of heating varies between the front surface side and the undersurface side, thereby causing warping of the resin member.

Even when the resin material itself has the low infrared absorption rate with nearly 100% of the infrared transmittance, the process of heating is possibly performed swiftly by increasing the amount of infrared radiation to the resin material with an increased output of the IR heater.

The resin material preferably has a high visible transmittance to a level allowing a visual assessment in a test using the microfluidic chip.

Such a resin material as above possibly includes acrylic resin such as polymethyl methacrylate (PMMA), polystyrene (PS), polycarbonate (PC), silicon-based resin, cycloolefin polymer (COP), and norbornene-based cyclic polyolefin such as cyclic olefin copolymer (COC), for example.

(Surface Treatment)

The chip components are subjected to surface treatment on their surfaces for thermocompression bonding. For the surface treatment, used is any chemical agent exemplified by an organic solvent. For surface modification of the chip components, plasma discharge is performed.

The surfaces of the chip components are washed using an organic solvent, and therefore the surfaces of the chip components are softened (swollen). This accordingly increases the degree of adhesion of the resin material during thermocompression bonding. Alternatively, the degree of adhesion of the resin material may be increased during thermocompression bonding by surface modification with plasma discharge on their bonding surfaces.

For the surface treatment using a chemical agent as above, used is an organic solvent including low-grade alcohol such as ethanol, or ester such as butyl acetate.

Note that such a process of surface treatment is performed as appropriate considering the degree of contact in the microfluidic chip, for example. Alternatively, the microfluidic chip may be manufactured by thermocompression bonding between the chip components with no process of surface treatment.

(Preheating)

Using an infrared lamp heater (IR heater), the process of preheating is performed to the chip components described above.

The chip components for thermocompression bonding have a high infrared transmittance as described above. The chip components are thus each exposed in its entirety almost uniformly to the infrared radiation coming from the IR heater. By being uniformly exposed to the infrared radiation as such, the chip components are uniformly increased in temperature internally. Herein, assuming that the surface of each of the chip components exposed to radiation from the IR heater is the front surface, and assuming that the surface opposite to the surface exposed to radiation from the IR heater is the undersurface, the average temperature will be almost the same on the surface-side temperature of the resin material, on the undersurface-side temperature thereof, and in the entire chip component. As such, any temperature difference in the chip component is possibly controlled during the process of preheating, thereby favorably preventing the chip components from warping.

In the process of preheating, the chip components are heated up to the deflection temperature under load of the resin material thereof or lower. As an example, the chip components are heated up to the temperature in a range of about ½ of the deflection temperature under load (° C.), or about 0.4 to 0.6 times higher the temperature. As an example, using a resin material with the deflection temperature under load of 135° C., the chip components are heated up to about 55 to 80° C.

The higher the heating temperature for the chip components in the process of preheating, the shorter the time taken for thermocompression bonding will be. This is because, by being heated up to a temperature close to the temperature during the process of thermocompression bonding, the chip components reach sooner the temperature for thermocompression bonding during the process thereof.

The IR heater in use is not specifically restricted in type, the level of output, and others as long as the chip components made of a transparent resin are sufficiently heated thereby.

(Thermocompression Bonding)

The chip components are subjected to thermocompression bonding (diffusion bonding), and a micro fluid path is formed therein. When the thermocompression bonding is not performed under the appropriate conditions, the resulting chip component may suffer a bonding failure, or the micro fluid path therein may be crushed and lost.

For manufacturing a microfluidic chip, any agent for bonding such as adhesive is not used to prevent any mixture thereof into a test sample. For bonding of the chip components, their bonding surfaces are brought in direct contact with each other.

In the process of thermocompression bonding, the chip components combined as above are kept hold by a thermocompression-bonding section, which is configured by upper and lower compression-bonding heads, for example. These compression-bonding heads apply pressure to the chip components from top and bottom. With the pressure remained applied, the temperature is increased, and then the process of thermocompression bonding (diffusion bonding) is performed. The resulting chip components are then cooled under the pressure, and then the pressure applied to the chip components is reduced by releasing the upper and lower compression-bonding heads.

By the process of thermocompression bonding as such, the chip components are combined together so that a microfluidic chip is formed.

Figure 2:
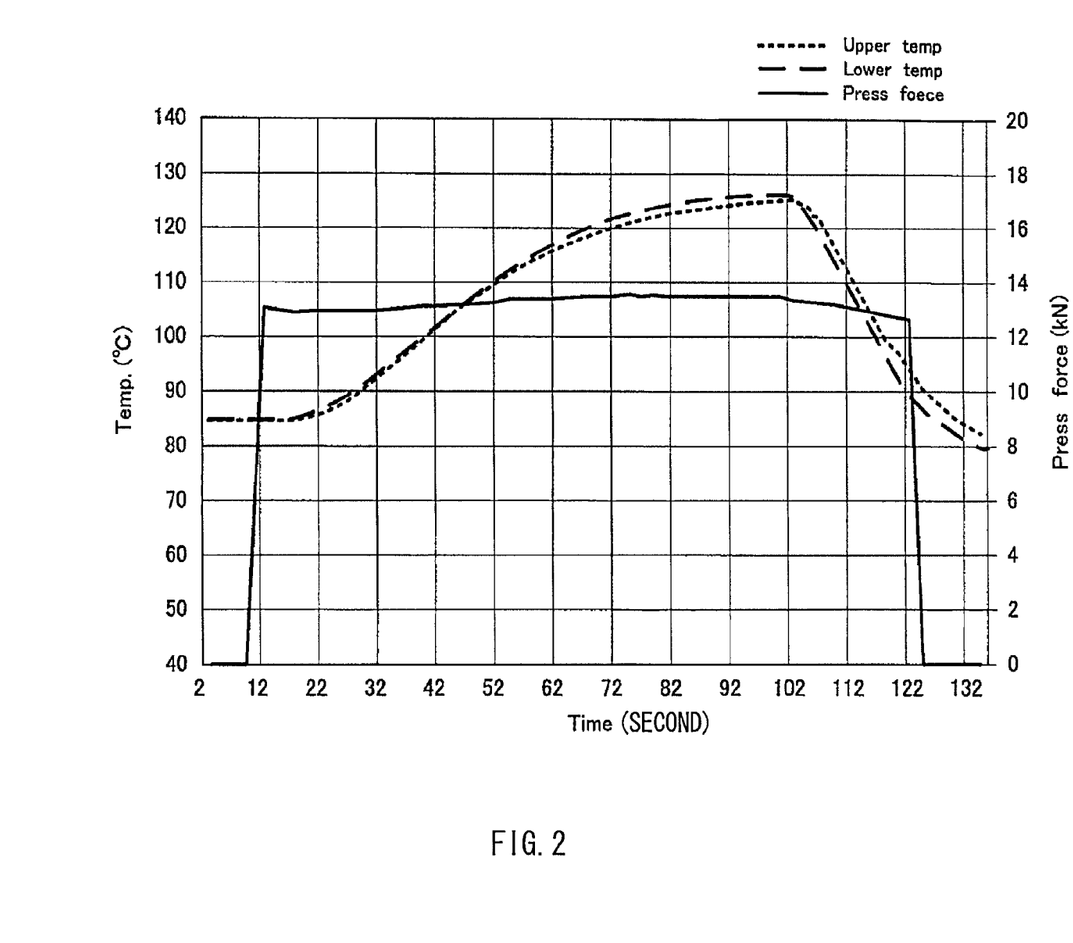
FIG. 2 is a diagram showing the relationship between the degree of pressurization, the temperature, and the time taken for thermocompression bonding during thermocompression bonding.

FIG. 2 shows an exemplary relationship between the degree of pressurization (Press Force) [kN] and the temperature [° C.] during the process of thermocompression bonding, and the time (seconds) after the process of thermocompression bonding is started. The temperature indicates the temperature of the upper compression-bonding head (Upper Temp), and the temperature of the lower compression-bonding head (Lower Temp).

The chip components combined one on the other are placed on the thermocompression-bonding section configured by the thermocompression-bonding heads, for example (0 to 2 seconds).

The chip components are then put under pressure (at 10 second point). The chip components are held under pressure of a predetermined level (at 13 second point). In the case of FIG. 2, the level of pressure is about 13 kN.

After the chip components are put under pressure, the heating is started to the chip components (at 27 second point). The chip components are already heated to the temperature of about 85° C. by the process of preheating. For this heating in the process of thermocompression bonding, the temperature range for thermocompression bonding is from a deflection point under load to a glass transition point. In the case of FIG. 2, the temperature for thermocompression bonding is set to about 125° C. for the heating. By the heating as such, the temperature starts increasing by degrees, and when the temperature reaches a predetermined value of the temperature for thermocompression bonding, the chip components are held in the state for a whole (from 82 to 105 second point). In the case of FIG. 2, the chip components are held at the set temperature for 23 seconds. With the process of preheating, the heating time is possibly reduced. Especially after the temperature reaches a predetermined value for thermocompression bonding, the time for holding the chip components in the state is possibly reduced.

After being held at the predetermined temperature for the predetermined length of time, the chip components are cooled under the pressure of the upper and lower thermocompression-bonding heads (after 105 second point). Then after the temperature is reduced to a sufficiently low value, the application of pressure is stopped (at 123 second point), and then the chip components are released from the thermocompression-bonding section.

When a resin material in use for the chip components has a melting point like a crystalline resin, the temperature for the process of thermocompression bonding is increased not to reach the melting point. When the resin material does not have a melting point like a noncrystalline resin, the temperature is increased not to reach the glass transition point.

If the chip components are heated up to the melting point of the resin material or higher, or up to the glass transition point of the resin material or higher, the micro fluid path formed in the chip component may be deflected or lost. Considering the bonding strength between the chip components, the time taken for bonding, and others, the chip components may need to be heated up to the deflection temperature under load or higher. As an exemplary criterion, the temperature for heating may be in a range from about the heat deflection point to about the glass transition point of the material of the chip components. Considering the shape stability of the micro fluid path formed in the chip component, the chip components are preferably heated to be about ±5° C. of the deflection temperature under load of the resin material, and more preferably, to be about ±2° C. of the deflection temperature under load thereof.

(Inspection)

The resulting microfluidic chip formed by thermocompression bonding of the chip components is then subjected to inspection. In the inspection, the microfluidic chip is checked against a plurality of inspection points. In an exemplary inspection, using a general-purpose laser displacement sensor, the micro fluid path formed inside of the microfluidic chip after the process of thermocompression bonding is measured by size. The resulting measurement value is then checked to determine whether it is in a predetermined range or not. Also using an image processing device, the microfluidic chip is checked for defects.

When the microfluidic chip is found defective, the chip is separated from other no-defective chips, and then is discarded, for example. When the microfluidic chip passes the inspection, it is subjected to a process of sterilization, packaging, or others if appropriate.

With the manufacture method of a microfluidic chip described above, the process of heating is performed in two steps, i.e., the process of preheating using the IR heater, and the process of thermocompression bonding by heating in the state under pressure. In the process of preheating, the chip components are uniformly heated up to the predetermined temperature so that the time taken for thermocompression bonding is possibly reduced. Moreover, by using the IR heater in the process of preheating, the resin material is heated uniformly, and therefore any warping of the resin material during heating thereof is prevented.

2. Embodiment of Device for Thermocompression Bonding

Figure 3:
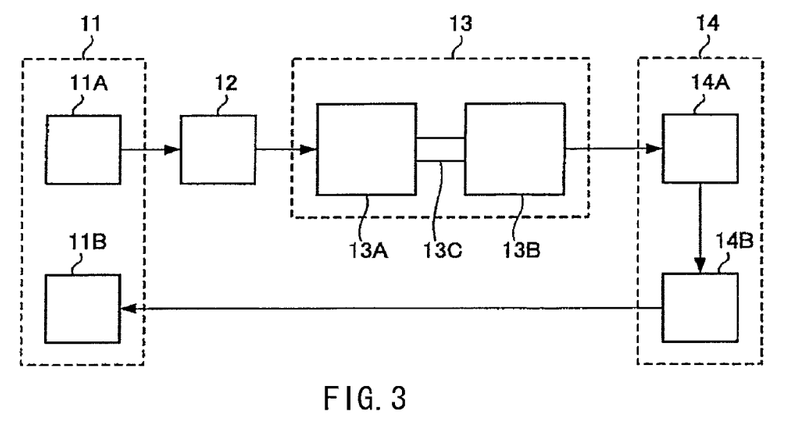
FIG. 3 is a block diagram showing an exemplary configuration of a manufacture device of a microfluidic chip as an embodiment of a device for thermocompression bonding of the present disclosure.

FIG. 3 shows an embodiment of a device for thermocompression bonding. The device for thermocompression bonding of FIG. 3 is a device for manufacturing a microfluidic chip by the manufacture processes described above.

(Manufacture Device of Microfluidic Chip)

The manufacture device of a microfluidic chip is configured to include a chip component supply/discharge section 11, a surface treatment section 12, a compression-bonding section 13, an inspection section 14, and a transfer section for transferring a chip component or a microfluidic chip between the component parts. The chip component supply/discharge section 11 is configured by a chip component supply section 11A, and a chip component discharge section 11B. The compression-bonding section 13 is configured by a preheating section 13A, and a thermocompression-bonding section 13B. The inspection section 14 is configured by a fluid path inspection section 14A, and a defect inspection section 14B.

The chip component supply section 11A stores a plurality of chip components each formed with a micro fluid path in advance. The chip components stored in the chip component supply section 11A as such are sent out for the manufacturing processes of a microfluidic chip.

The surface treatment section 12 is provided with a surface treatment device for the chip components coming from the chip component supply section 11A. The surface treatment device includes an exposure processing device using an organic solvent, e.g., an immersion device or a spray device. Alternatively, a plasma radiation device may be provided.

In the surface treatment device, the chip components are subjected to surface treatment by plasma discharge on the thermocompression-bonding surfaces thereof, or by exposure thereof to an organic solvent. The resulting chip components after the surface treatment are transferred by the transfer section from the surface treatment section 12 to the preheating section 13 of the compression-bonding section 13.

The preheating section 13A is provided with an infrared radiation section. The infrared radiation section includes an infrared lamp heater (IR heater), for example. Using the IR heater, infrared radiation is directed to the surface-treated chip components coming from the surface treatment section 12. By infrared absorption, the chip components are preheated. The preheated chip components are then transferred by a transfer section 13C to the thermocompression-bonding section 13B also in the compression-bonding section 13. At this time, the transfer section 13C transfers the chip components from the preheating section 13A to the thermocompression-bonding section 13B with the preheating temperature remained as it is.

The thermocompression-bonding section 13B forms a microfluidic chip by thermocompression bonding of the chip components coming from the preheating section 13A. The thermocompression-bonding section 13B is configured by a pressurization section, and a heating section. The pressurization section is exemplified by upper and lower compression-bonding heads for use to combine together the chip components, and then to put these under pressure. The heating section is used to heat the pressurization section. In the thermocompression-bonding section 13B, the two chip components are combined together on their bonding surfaces, and then are put under pressure. The chip components are then heated under the pressure for thermocompression bonding (diffusion bonding). As such, in the thermocompression bonding section 13B, a microfluidic chip is formed by the chip components. The microfluidic chip formed by the compression-bonding section 13 as such is then directed to the fluid path inspection section 14A of the inspection section 14.

The fluid path inspection section 14A is provided with a general-purpose laser displacement sensor, for example. The micro fluid path in the microfluidic chip formed by the process of thermocompression bonding is then measured by size. The microfluidic chip is then forwarded to the defect inspection section 14B. The defect inspection section 14B includes an image processing device, for example. The microfluidic chip is then identified by state using an image, and is then checked for defects. The microfluidic chip after the inspection is forwarded from the inspection section 14 to the chip component discharge section 11B of the chip component supply/discharge section 11.

In the chip component discharge section 11B, when the microfluidic chip is found defective in the inspection, for example, the chip is separated from others and then is discarded in the chip component discharge section 11B. When the microfluidic chip successfully completes the inspection, the chip is directed to the outside of the device from the chip component supply/discharge section 11. The finished microfluidic chip is subjected to processes of sterilization, packaging, and others using other devices if appropriate before appearing on the market.

Note that, in the manufacture device of the microfluidic chip described above, when the process of surface treatment is not performed, the surface treatment section 12 is not necessarily provided. In an alternative configuration, the component parts, i.e., the chip component supply/discharge section 11 and the inspection section 14, may be configured as a device separately from the manufacture device of the microfluidic chip. As an exemplary configuration, the manufacture device of the microfluidic chip serves well only with the compression-bonding section 13, and may not necessarily include therein the chip component supply/discharge section 11 and the inspection section 14. Moreover, the inspections described above, i.e., the fluid path inspection and the defect inspection, are no more than exemplary inspections to be made in the inspection section 14, and if appropriate, any other inspection section may be provided.

3. Example of Method for Thermocompression Bonding

In the below, while the present disclosure is described specifically by Example and Comparative Example, the description will be in all aspects illustrative and not restrictive. In Example and Comparative Example below, with the manufacture method of the microfluidic chip, a preheated chip component is measured and assessed in terms of the temperature and the degree of warping.

EXAMPLE

Figure 4:
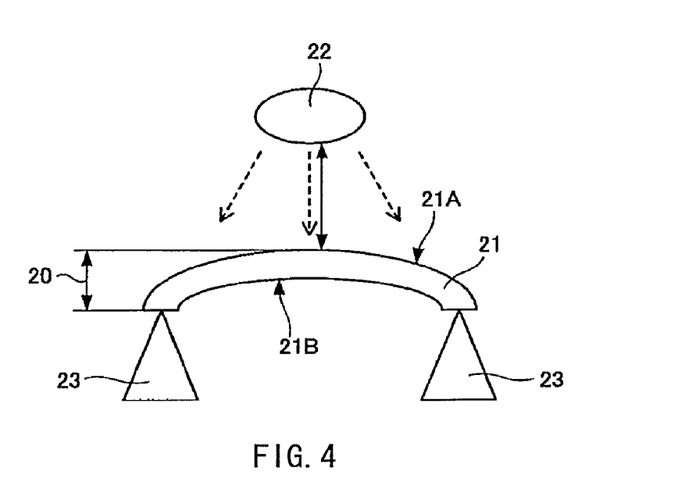
FIG. 4 is a diagram showing a measurement method of the degree of warping of a resin member for use in Example.

FIG. 4 shows a method of measuring the degree of warping to be caused to a chip component heated by an infrared lamp heater (IR heater).

As shown in FIG. 4, a chip component 21 was so disposed that its end portions come in contact with support sections 23, and then was heated by an IR heater 22 from above. The chip component 21 in use was a cycloolefin polymer (Zeonex™ 480 manufactured by Zeon Corporation) with the dimensions as 25×75 mm and the thickness of 1 mm. The output of the IR heater 22 was set to 1200 w, and the distance from the IR heater 22 to a surface 21A of the chip component 21 was set to be 80 mm.

The chip component 21 was heated from the room temperature (about 25° C.) to about 70° C.

With the configuration of FIG. 4, the surface 21A side closer to the IR heater 22 was exposed more to the infrared radiation, and was higher in temperature than an undersurface 21B. As a result, the surface 21A side swelled more than the undersurface 21B, thereby causing such warping of the surface as shown in FIG. 4. Therefore, in this Example, on the surface 21A side of the chip component 21, a distance 20 from the lowest point of each of the end surfaces to the top portion around the center was regarded as the degree of warping of the chip component 21.

With the method as such, the temperature on the undersurface 21B side of the chip component 21 was measured together with the degree of warping of the chip component 21.

Described next are a resin material and an IR heater for use in Example.

Figure 5A:
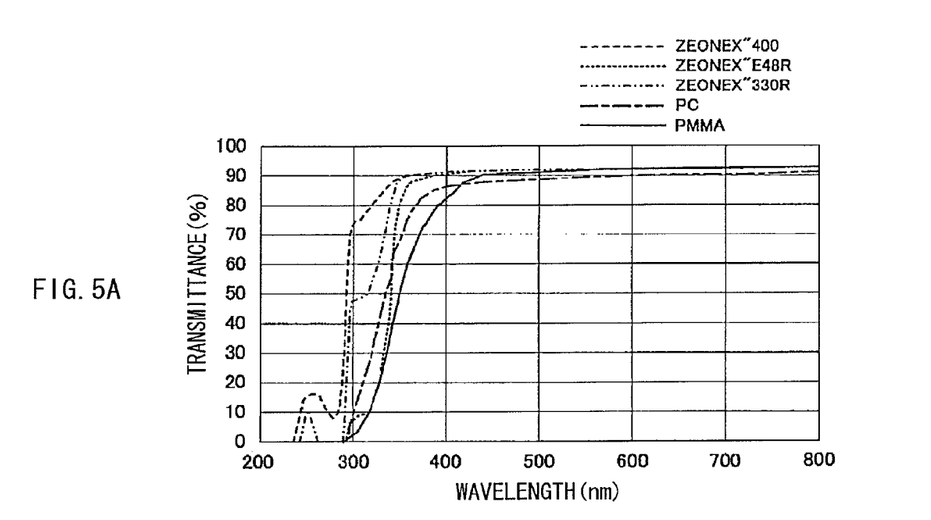
FIGS. 5A and 5B are each a diagram showing the optical properties of the resin member for use in Example.
Figure 5B:
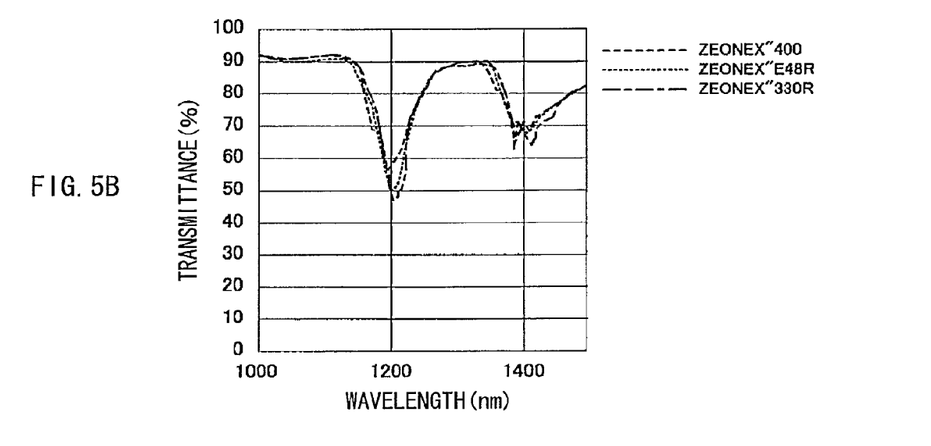
Figure 6:
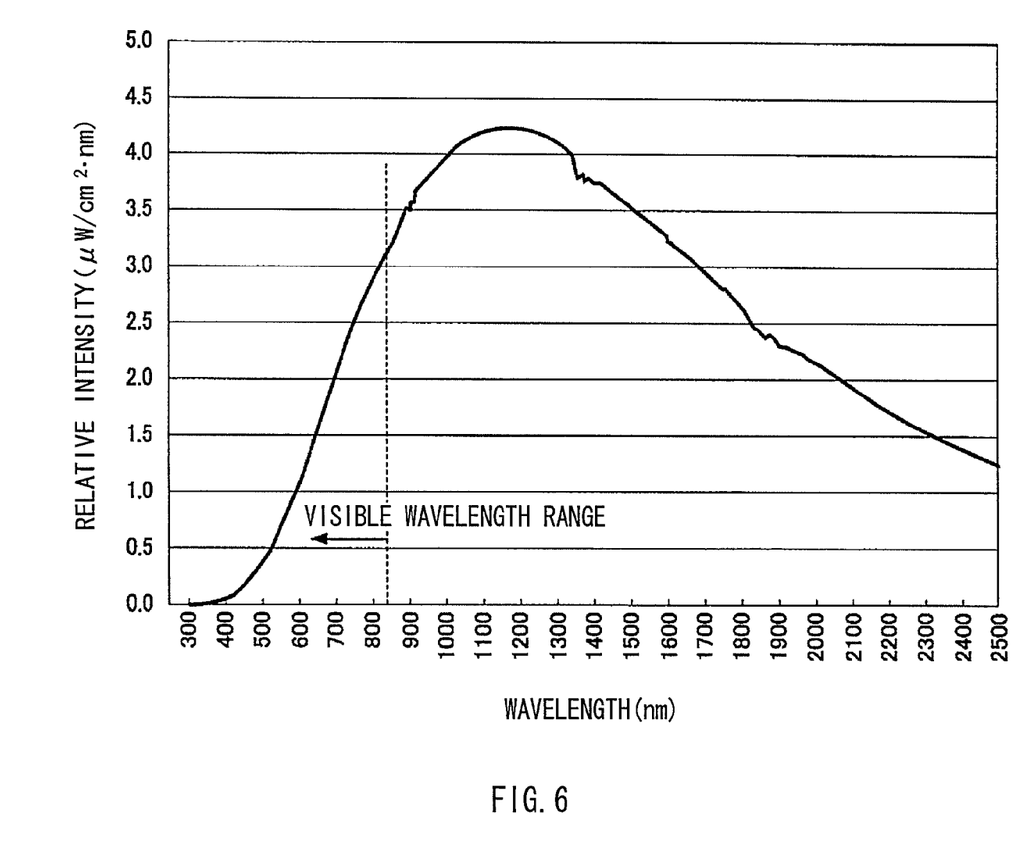
FIG. 6 is a diagram showing the spectral radiant intensity of an infrared lamp heater for use in Example.

FIGS. 5A and 5B each show the light transmittance [%] of the Zeonex 480 used in Example. FIGS. 5A and 5B also show the light transmittance [%] of any exemplary resin material available for use as a chip component together with the Zeonex 480, e.g., Zeonex E48R and Zeonex 330R (these are each a cycloolefin polymer manufactured by Zeon Corporation), polycarbonate resin (PC), and polymethyl methacrylate resin (PMMA). FIG. 6 shows the typical properties of a general IR heater, i.e., spectral radiant intensity.

As shown in FIG. 5A, the above-described resin materials all have a high transmittance of about 80 to 90% in the visible wavelength range of 400 to 800 nm.

Moreover, as shown in FIG. 5B, the cycloolefin polymer of Zeonex 480, Zeonex E48R, and Zeonex 330R all show a peak of absorption at about 1200 nm and 1400 nm in the infrared wavelength range of 1000 nm or more. At the peak of absorption at about 1200 nm, the cycloolefin polymer described above shows a reduction of transmittance from 90% to about 50%. Furthermore, at the peak of absorption at about 1400 nm, the cycloolefin polymer described above shows a reduction of transmittance from 90% to about 60%.

Moreover, as shown in FIG. 6, the IR heater shows the wavelength distribution in which the intensity shows a gradual decrease with a peak of about 1200 nm. In the wavelength range at the peak of absorption of the resin material, the radiation is not uniform because the radiation surface side shows a high degree of absorption, and the infrared radiation is reduced in intensity before reaching the undersurface side. However, the infrared radiation is sufficient in degree also with the wavelength not at the peak of absorption, and the chip component is thus possibly exposed uniformly to the radiation.

COMPARATIVE EXAMPLE

Figure 7:
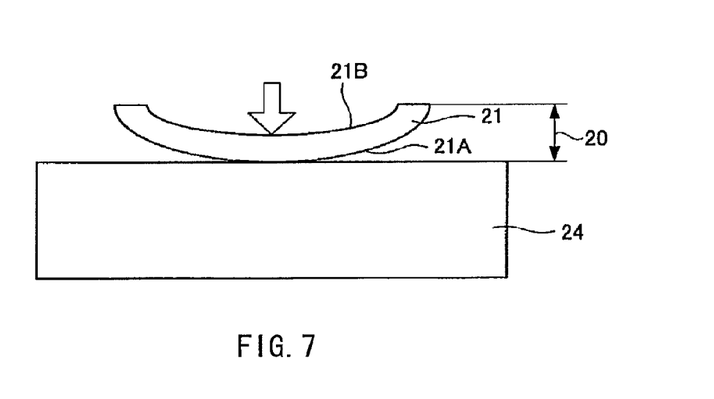
FIG. 7 is a diagram showing a measurement method of the degree of warping of a resin member for use in Comparative Example.

FIG. 7 shows a method of measuring the degree of warping to be caused to a chip component heated using a heated plate.

As shown in FIG. 7, the chip component 21 was disposed on a heated plate 24 for a measurement of the degree of warping of the chip component 21. The surface temperature of the heated plate 24 was set to 64° C. As in Example, the chip component 21 was the Zeonex 480 manufactured by Zeon Corporation with the dimensions of 25×75 mm and the thickness of 1 mm. Note that, in FIG. 7, the surface of the chip component 21 in contact with the heated plate 24 was regarded as the surface 21A, and the surface thereof not in contact with the heated plate 24 was regarded as the undersurface 21B.

With the configuration of FIG. 7, the surface 21A in contact with the heated plate 24 was heated first, and thus the surface 21A side swelled more than the undersurface 21B, and thus the surface was warped. In consideration thereof, the degree of warping of the chip component 21 was thus regarded as the distance 20, i.e., from the portion where the surface 21A of the chip component 21 was in contact with the heat plate 24 to the top portion on the end surface.

(Result)

Figure 8:
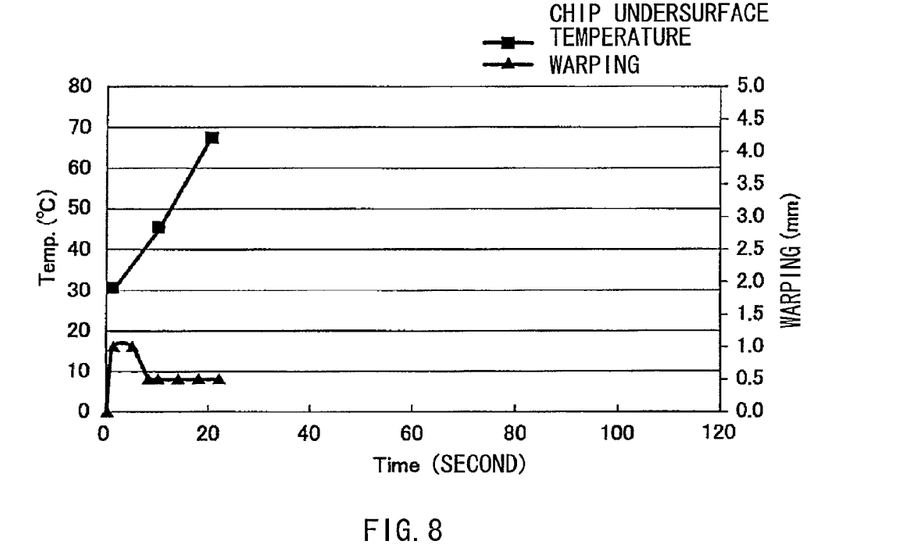
FIG. 8 is a diagram showing the relationship between the temperature, the degree of warping, and the time taken for preheating in Example.
Figure 9:
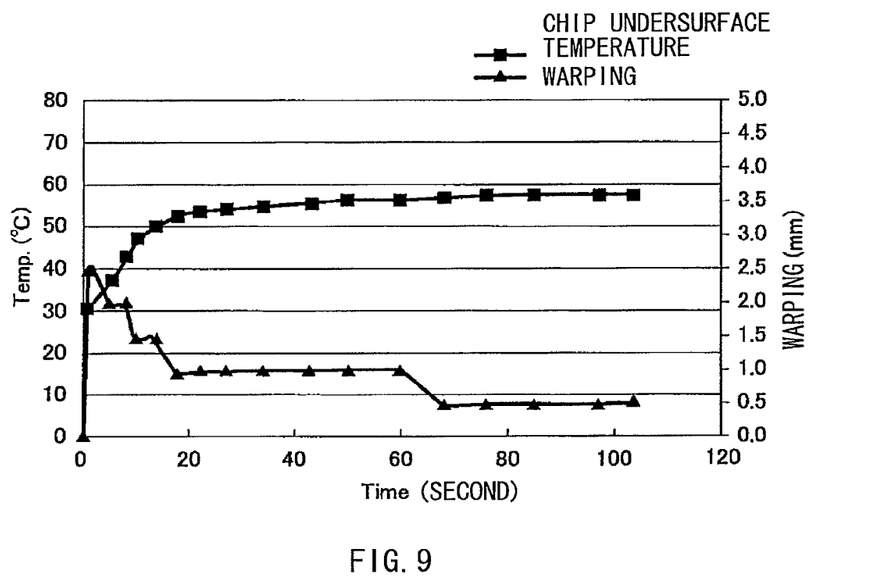
FIG. 9 is a diagram showing the relationship between the temperature, the degree of warping, and the time taken for preheating in Comparative Example.

FIG. 8 shows the relationship between the measurement results about the chip component 21 in Example as above, i.e., the relationship between the degree of warping of the chip component 21, the temperature of the chip component 21 on the undersurface 21B side, and the preheating time. FIG. 9 shows the relationship in Comparative Example, i.e., the relationship between the degree of warping of the chip component 21, the temperature of the chip component 21 on the undersurface 21B side, and the preheating time.

The result of FIG. 8 shows that, in Example, the degree of warping is temporarily increased to be about 1 mm immediately after the infrared radiation, but is immediately reduced to be about 0.5 mm and then is stabilized thereat. The undersurface of the chip component is at the temperature of about 40° C. when the degree of warping thereof is stably 0.5 mm. Herein, it takes about 20 seconds before the degree of warping is stabilized, and before the undersurface temperature reaches a predetermined value for preheating.

As such, by heating the chip component using the IR heater, the heat swiftly reaches the undersurface side of the chip component. What is more, even if the chip component is heated up to a predetermined temperature in a short time, the resulting degree of warping is small. As such, with the process of preheating using the IR heater, the chip component is possibly heated uniformly and in a short time.

In Comparative Example, as shown in FIG. 9, the degree of warping is increased to about 2.5 mm immediately after the heating. Also in Comparative Example, after a lapse of about 20 seconds, the degree of warping is stabilized at about 1.0 mm, but the temperature on the undersurface is about 50° C., i.e., is not yet at a predetermined value for preheating. As such, to achieve the degree of warping stably at 0.5 mm as in Example, the chip component is expected to be heated more for about 70 seconds to increase the undersurface temperature to about 60° C.

In Example and Comparative Example described above, the degree of warping stably at a low value means the heat distribution being uniform in the chip component. In Comparative Example, the surface side in contact with the heated plate is increased in temperature, and only the surface side swells. The degree of warping is thus increased immediately after the heating. Thereafter, with a lapse of time, the heat distribution becomes uniform because the heat on the surface in contact with the heated plate is transferred to the undersurface side so that the degree of warping is reduced with the increasing undersurface temperature. As such, the entire chip component is heated almost uniformly so that the degree of warping becomes stable.

On the other hand, with the process of preheating using the IR lamp heater as in Example, the process of preheating is completed in a short time, and any possible warping is prevented from occurring.

Note that, in the embodiment described above, exemplified is the case of applying the method for thermocompression bonding in the embodiment of the present disclosure to a microfluidic chip made of transparent resin. The present disclosure is applicable to numerous other modifications and variations.

As an example, the present disclosure is applicable under the conditions of; a chip component is possibly exposed uniformly to infrared radiation as does not absorb the infrared radiation that much, and thermocompression bonding (diffusion bonding) to be performed is to a resin material possibly heated by infrared radiation.

Moreover, in the embodiment described above, an infrared lamp heater is used for heating of a resin material. The infrared radiation section as such is not specifically restricted in type as long as a resin material is possibly heated by infrared radiation. The infrared radiation section may provide ultraviolet radiation and visible radiation together with infrared radiation as long as the infrared radiation is with any necessary level of intensity.

While the present disclosure has been described in detail, the foregoing description is in all aspects illustrative and not restrictive. It is understood that numerous other modifications and variations are to be devised without departing from the scope of the present disclosure.

What is claimed is:

1. A device for thermocompression bonding, comprising:
   a preheating section including an infrared radiation section, wherein the preheating section is configured to uniformly expose a chip component with micro fluid paths comprising a resin member to radiation having a wavelength at which said resin member has a transmittance of between 80% and 100% for a time sufficient to produce a surface-side temperature of the resin member substantially the same as an undersurface-side temperature of the resin member and thereby limit warping of the resin member;
   a thermocompression-bonding section comprising a heating section and a pressurization section, wherein the pressurization section comprises upper and lower compression-bonding heads for pressing two chip components received from said preheating section against one another and wherein the heating section is configured to heat the upper and lower compression-bonding heads not to reach a melting point of a crystalline resin or not to reach to reach a glass transition of a noncrystalline resin; and
   a transfer section transferring the resin member to the thermocompression-bonding section from the preheating section while the resin member remains in a preheated state.

2. The device of claim 1, further comprising a chip component supply and discharge section configured to supply chip components to the preheating section and the thermocompression-bonding section.

3. The device of claim 2, further comprising a surface treatment section adapted to subject the chip component supplied from the chip component supply and discharge section to a surface treatment.

4. The device of claim 3, further comprising an inspection section including a fluid path inspection section and a defect inspection section.

5. The device of claim 4, wherein the fluid path inspection section includes a sensor for sensing a microfluid path within the resin member.

6. The device of claim 4, wherein the defect inspection section includes an image processing device adapted to identify defects within the resin member.

7. The device of claim 1, wherein the resin member has an infrared transmittance of 85% or higher but lower than 95% except at the wavelength range where the absorption peak exists.

8. A device for thermocompression bonding, comprising:
   a preheating section including an infrared radiation section, wherein the preheating section is configured to uniformly expose a chip component with micro fluid paths comprising a resin member to radiation having a wavelength at which said resin member has a transmittance of between 80% and 100%, excepting at a peak of absorption, for a time sufficient to produce a surface-side temperature of the resin member substantially the same as an undersurface-side temperature of the resin member and thereby limit warping of the resin member, wherein the resin member has an infrared transmittance of 40% or higher but lower than 100% at the wavelength range where the absorption peak exists;

a thermocompression-bonding section comprising a heating section and a pressurization section, wherein the pressurization section comprises upper and lower compression-bonding heads for pressing two chip components received from said preheating section against one another and wherein the heating section is configured to heat the upper and lower compression-bonding heads not to reach a melting point of a crystalline resin or not to reach to reach a glass transition of a noncrystalline resin; and a transfer section transferring the resin member to the thermocompression-bonding section from the preheating section while the resin member remains in a preheated state.

* * * * *